United States Patent [19]
Takeuchi et al.

[11] Patent Number: 5,217,550
[45] Date of Patent: Jun. 8, 1993

[54] ALIGNMENT TRANSFER METHOD

[75] Inventors: Satoshi Takeuchi; Kenji Asaka, both of Tokyo, Japan

[73] Assignee: Dai Nippon Printing Co., Ltd, Japan

[21] Appl. No.: 764,621

[22] Filed: Sep. 24, 1991

[30] Foreign Application Priority Data

Sep. 28, 1990 [JP] Japan .................. 2-259303

[51] Int. Cl.⁵ .................................... B32B 31/00
[52] U.S. Cl. ................................ 156/64; 156/229; 156/230; 156/361; 156/362; 156/541
[58] Field of Search .................. 156/64, 230, 233, 234, 156/229, 273.9, 277, 379.8, 362, 361, 540, 541; 53/51

[56] References Cited

U.S. PATENT DOCUMENTS

| | | | |
|---|---|---|---|
| 4,452,659 | 6/1984 | Guertsen et al. | 156/361 |
| 4,539,063 | 9/1985 | Cué et al. | 156/361 |
| 4,859,269 | 8/1989 | Nishiguchi | 156/361 |
| 4,902,371 | 2/1990 | Andris et al. | 156/64 |
| 5,047,110 | 9/1991 | Bryant et al. | 156/540 |
| 5,073,223 | 12/1991 | Kurihara | 156/362 |

*Primary Examiner*—Jill L. Heitbrink
*Attorney, Agent, or Firm*—Ladas & Parry

[57] ABSTRACT

Prior to the press-contact between a pattern-transferring flat plate and a transfer-receiving flat plate, at least one of these flat plates is moved to a predetermined position to effect the positioning therebetween, while the positional relation between the pattern-transferring flat plate and the transfer-receiving flat plate is optically observed, and thereafter these flat plates are sequentially press-contacted to each other from an end of the flat plates. Therefore, there is no positional difference between the flat plates which have been correctly positioned, and further the adhesion strength between the transfer pattern and the transfer-receiving flat plate is uniform.

4 Claims, 8 Drawing Sheets

ALIGNMENT TRANSFER METHOD

BACKGROUND OF THE INVENTION

The present invention relates to an alignment transfer method, and more specifically to an alignment transfer method which is capable of correctly effecting the transfer of a transfer pattern to a transfer-receiving flat plate with uniform adhesion strength, high positioning precision, and high reproducibility. For example, the present invention is particularly preferably applicable to the production of a thin film semiconductor element (or component).

For example, in the case of the production of a thin film semiconductor element, it is necessary to correctly prepare a minute pattern for forming a circuit or an element.

In the production of such a thin film semiconductor element, for example, it is conceivable to use a method wherein a resist ink is directly applied onto a work (or material to be subjected to processing); or a photoresist layer is formed thereof by coating in advance, the work is supplied with a printing ink layer which has a predetermined configuration (or pattern) and is capable of intercepting ultraviolet rays, by a printing process, the resultant work is subjected to exposure and development steps, and then is subjected to an etching treatment, thereby to provide a minute pattern for forming an electric circuit or element.

In such a process, in order to correctly form the minute pattern for forming a circuit or an element of a thin film semiconductor by use of a printing process, it is necessary to provide a uniform adhesion strength between a member (or material) to be printed and a printing ink pattern, and to effect correct positioning (or registration) between printed pattern which has already been formed on the member to be printed, and a pattern of the printing ink to be newly subjected to printing.

However, in the so-called parallel flat plate printing method practiced in the prior art, the close contact between a pattern receiving flat plate on which a printing ink pattern has been formed, and a member to be printed (flat plate to be printed) is simultaneously effected over the entire area of both of these flat plates. As a result, in the prior art, local failure in the close contact between the flat plates is liable to occur, and therefore it is difficult to attain uniform adhesion strength therebetween.

Further, in the conventional printing process, in general, the positioning (or registration) between the member to be printed and the printing ink pattern is regulated by using preliminary printing in advance. When good results are obtained in a certain step of the preliminary printing, the printing ink pattern is actually transferred to the member to be printed. In the prior art, even when the positional relation between the member to be printed and the printing ink pattern is changed to a certain extent, the transfer of the printing ink pattern is generally continued regardless of such a change.

Accordingly, the positioning precision and reproducibility in the positioning of the printing ink pattern to be transferred to the member to be printed by the conventional printing process using the parallel flat plates is at most 20 to 30 $\mu$m, which does not reach the level of the positioning precision and reproducibility required for an electroconductive minute pattern for the thin film semiconductor element, etc.

SUMMARY OF THE INVENTION

A principal object of the present invention is, in view of the above problems encountered in the prior art, to provide an alignment transfer method which is capable of correctly transferring a transfer pattern (or transferable pattern) of a pattern-transferring flat plate for a parallel flat plate method to a transfer-receiving flat plate with high positioning precision and reproducibility comparable therewith while attaining uniform adhesion strength between the flat plates, and may preferably be used for, e.g., the production of a thin film semiconductor element.

According to one aspect of the present invention, there is provided an alignment transfer method comprising:

disposing a transfer-receiving flat plate carrying a work side register mark and a pattern-transferring flat plate comprising a flexible substrate, and a transferable transfer pattern and a pattern side register mark provided thereon so that they are disposed opposite to each other with a uniform registration gap; and moving at least one of the pattern-transferring flat plate and the transfer-receiving flat plate in accordance with the information provided by an observation optical system while maintaining the registration gap and optically observing the positional relation between the pattern side register mark and the work side register mark by means of the observation optical system; thereby to effect positioning between both of the flat plates;

nipping an end of the pattern-transferring flat plate and an end of the transfer-receiving flat plate so that the ends are caused to closely contact each other to be fixed, while maintaining the registration gap; and then sequentially press-contacting the entire surfaces of both flat plates to each other from the fixed end position thereof; and peeling the press-contacted flat plates from each other from an end side thereof thereby to transfer the transfer patterns to the transfer-receiving flat plate.

According to another aspect of the present invention, there is provided an alignment transfer method comprising:

fixing an end of the pattern-transferring flat plate comprising a flexible substrate, and the transferable transfer pattern and a pattern side register mark provided thereon, and applying a tensile load to the other end thereof to stretch the pattern-transferring flat plate; disposing the transfer-receiving flat plate carrying a work side register mark and the pattern-transferring flat plate so that they are disposed opposite to each other with a uniform registration gap; and moving at least one of the pattern-transferring flat plate and the transfer-receiving flat plate in accordance with the information provided by an observation optical system while maintaining the registration gap and optically observing the positional relation between the pattern side register mark and the work side register mark by means of the observation optical system, thereby to effect positioning between both of the flat plates;

causing the entire surfaces of the pattern-transferring flat plate and the transfer-receiving flat plate to closely contact each other; and then sequentially press-contacting the entire surfaces of both flat plates to each other from one end position thereof; and peeling the press-contacted flat plates from each other from an end side thereof thereby to transfer the transfer pattern to the transfer-receiving flat plate.

According to still another aspect of the present invention, there is provided an alignment transfer method comprising:

fixing an end of the pattern-transferring flat plate comprising a flexible substrate; and the transferable transfer pattern and a pattern side register mark provided thereon, and applying a tensile load to the other end thereof to stretch the pattern-transferring flat plate; disposing the transfer-receiving flat plate carrying a work side register mark and the pattern-transferring flat plate so that they are disposed opposite to each other with a uniform registration gap; and moving at least one of the pattern-transferring flat plate and the transfer-receiving flat plate in accordance with the information provided by an observation optical system while maintaining the registration gap and optically observing the positional relation between the pattern side register mark and the work side register mark by means of the observation optical system, thereby to effect positioning between both of the flat plates; and sequentially press-contacting the pattern-transferring flat plate and the transfer-receiving flat plate to each other from an end thereof, while maintaining the registration gap, thereby to transfer the transfer pattern to the transfer-receiving flat plate.

According to the alignment transfer method of the present invention, the adhesion strength between the pattern-transferring flat plate and the transfer-receiving flat plate, and the uniformity in such an adhesion strength may be improved so that the transfer pattern (or pattern to be transferred) may correctly be transferred to the transfer-receiving flat plate with high precision. In addition, in the present invention, the registration between the transfer pattern and the transfer-receiving flat plate may be effected while the positional relation therebetween is optically or electrooptically observed. As a result, the present invention may also provide an alignment transfer method wherein the precision in the transfer of the transfer pattern to the transfer-receiving flat plate is further improved.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Hereinbelow, the present invention will specifically be described with reference to preferred embodiments thereof.

FIG. 1 shows a relation between a pattern-transferring flat plate 1 and a transfer-receiving flat plate 2.

Figure 1A:
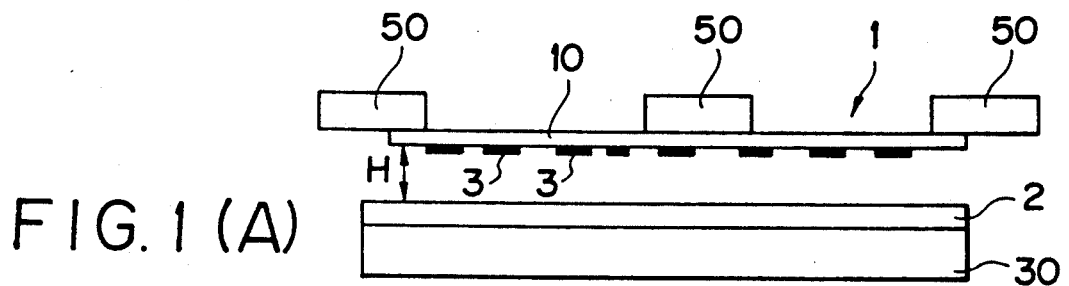
FIGS. 1(A) to 1(F) are schematic views for sequentially illustrating the relation between a pattern-transferring flat plate and a transfer-receiving flat plate in each of sequential steps used in an embodiment of the alignment transfer method according to the present invention.

As shown in FIG. 1(A), the pattern-transferring flat plate 1 is first disposed opposite to the transfer-receiving flat plate 2 with a uniform registration gap H.

In the pattern-transferring flat plate 1, a transfer pattern 3 which is transferable to the transfer-receiving flat plate 2 is formed, and a pattern side register mark (not shown) is also formed for the purpose of precise positioning between the pattern-transferring flat plate 1 and the transfer-receiving flat plate 2.

The transfer pattern 3 may preferably be formed by using various printing inks or metal thin films. However, when the transfer pattern 3 is formed by use of a metal thin film, it is necessary to provide an appropriate adhesive layer on a surface of the metal thin film contacting the transfer-receiving flat plate 2 or a surface of the transfer-receiving flat plate 2 contacting the metal thin film. The adhesive layer may for example comprise a universal adhesive (agent) such as vinyl chloride or vinyl acetate type, natural rubber type, synthetic rubber type, various acrylate types, and epoxy type; a heat sensitive thermoplastic adhesive, a light curing (or light hardening) adhesive, or an electrodeposition resin based on electrophoresis, etc.

The pattern-transferring flat plate 1 on which the transfer-pattern 3 and the pattern side register mark are formed has a flexibility and can be caused to closely contact the transfer-receiving flat plate 2 from the end side thereof in a state wherein a predetermined registration gap H therebetween is maintained.

Such a flexible pattern-transferring flat plate 1 may comprise a substrate 10 having a flexibility and the transfer pattern 3 and the pattern side register mark disposed thereon. Specific examples of the material constituting the flexible substrate 10 may include metal thin plates, resin sheets, etc.

In the transfer-receiving flat plate 2 to which the transfer pattern 3 is to be transferred, a work side register mark (not shown) is formed for the purpose of precise positioning between the pattern-transferring flat plate 1 and the transfer-receiving flat plate 2.

In FIG. 1(A), a reference numeral 30 denotes a work surface plate for retaining the transfer-receiving flat plate 2 and a reference numeral 50 denotes a flat plate holder for retaining the pattern-transferring flat plate 1.

Then, the positioning (or registration) between the pattern-transferring flat plate 1 and the transfer-receiving flat plate 2 is effected.

Figure 1B:
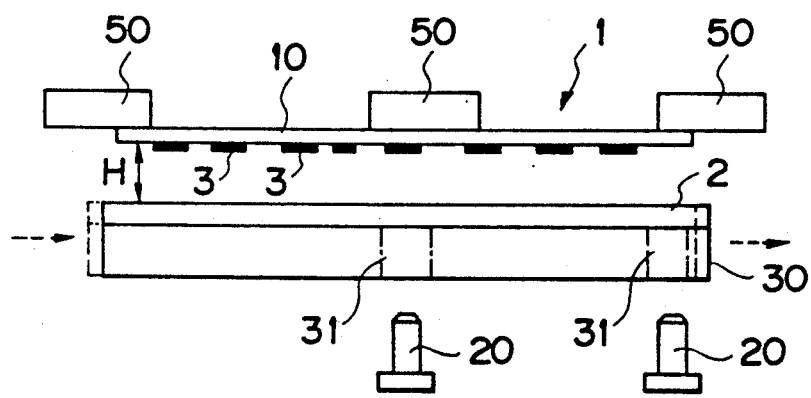

The positioning (or registration) between the pattern-transferring flat plate 1 and the transfer-receiving flat plate 2 disposed opposite to each other with the registration gap H is effected as shown in FIG. 1(B). More specifically, as shown in FIG. 1(B), in a state where the registration gap H is maintained, while the positional relation between the pattern side register mark disposed on the pattern-transferring flat plate 1 and the work side register mark disposed on the transfer-receiving flat plate 2 is optically observed by means of an observation optical system 20, at least one of the pattern-transferring flat plate 1 and the transfer-receiving flat plate 2 is moved, in accordance with the information provided by the observation optical system 20 to a position at which a predetermined relation between the pattern side register mark and the work side register mark is observed.

Figure 2A:
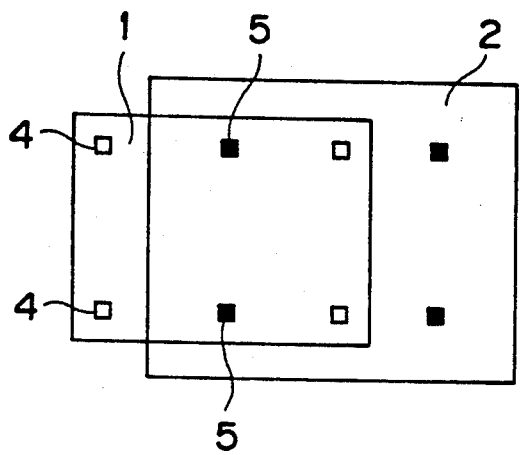
FIGS. 2(A) and 2(B) are schematic views for illustrating the information obtained by an observation optical system with respect to the positional relation between a pattern side register mark and a work side register mark used in an embodiment of the alignment transfer method according to the present invention.
Figure 2B:
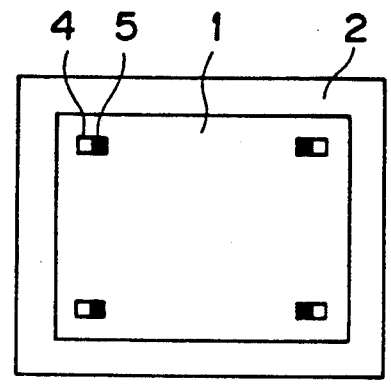

More specifically, as shown in FIG. 2(A), when there is a difference between the position of the pattern side register mark 4 provided on the pattern-transferring flat plate 1 and that of the work side register mark 5 provided on the transfer-receiving flat plate 2, at least one of the pattern-transferring flat plate 1 and the transfer-receiving flat plate 2 is moved to a position at which a predetermined relation between the pattern side register mark 4 and the work side register mark 5 is observed, as shown in FIG. 2(B). In this embodiment, as shown in FIG. 1(B), the work surface plate 30 carrying thereon the transfer-receiving flat plate 2 may be moved in the direction of an arrow of a broken line from a position denoted by a broken line to a position denoted by a solid line, thereby to effect the registration.

It is preferred to effect the above registration with respect to a plurality of combinations of the pattern side register mark 4 and the work side register mark 5.

The observation optical system 20 may be constituted, e.g., by use of a microscope, a CCD (charge coupled device), etc.. Further, it is also possible to constitute the observation optical system 20 by suitably using a known laser optical system. Particularly, a control mechanism based on a known laser optical system is advantageous to the positioning with high precision. It is preferred to provide at least two observation optical systems 20. When two or more observation optical systems 20 are provided, it is possible to simultaneously effect observation at plural positions. However, even in a case where only a single observation optical system 20 is provided, it is possible to effect observation at plural positions if the observation optical system 20 is movable. In FIG. 1(B), a reference numeral 31 denotes an observation hole provided in the work surface plate 30.

In this embodiment, the transfer-receiving flat plate 2 is transparent.

Figure 3:
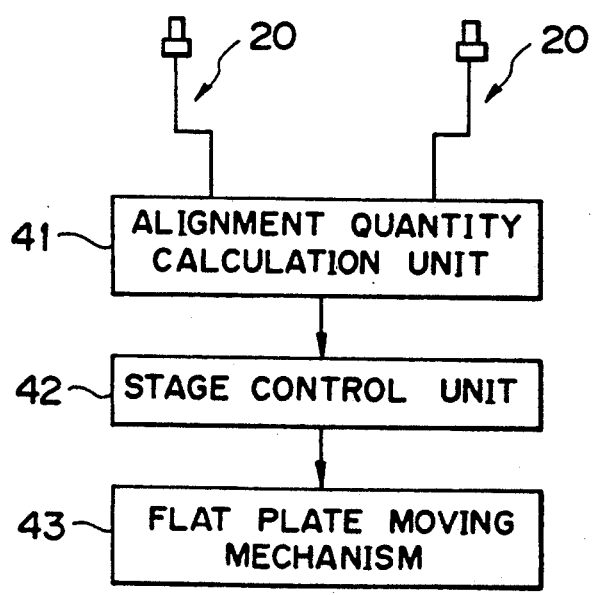
FIG. 3 is a schematic view showing an embodiment of the alignment transfer apparatus which can preferably be used in the alignment transfer method according to the present invention.

In order to move at least one of the pattern-transferring flat plate 1 and the transfer-receiving flat plate 2 in accordance with the information provided by the observation optical system 20, for example, it is possible to connect the observation optical system 20 with a flat plate moving mechanism 43 by the medium of an alignment quantity calculation unit 41 and a stage control unit 42, as shown in FIG. 3.

The alignment quantity calculation unit 41 has a function of calculating the positional difference between the pattern side register mark and the work side register mark on the basis of the information provided by the observation optical system 20.

Figure 4:
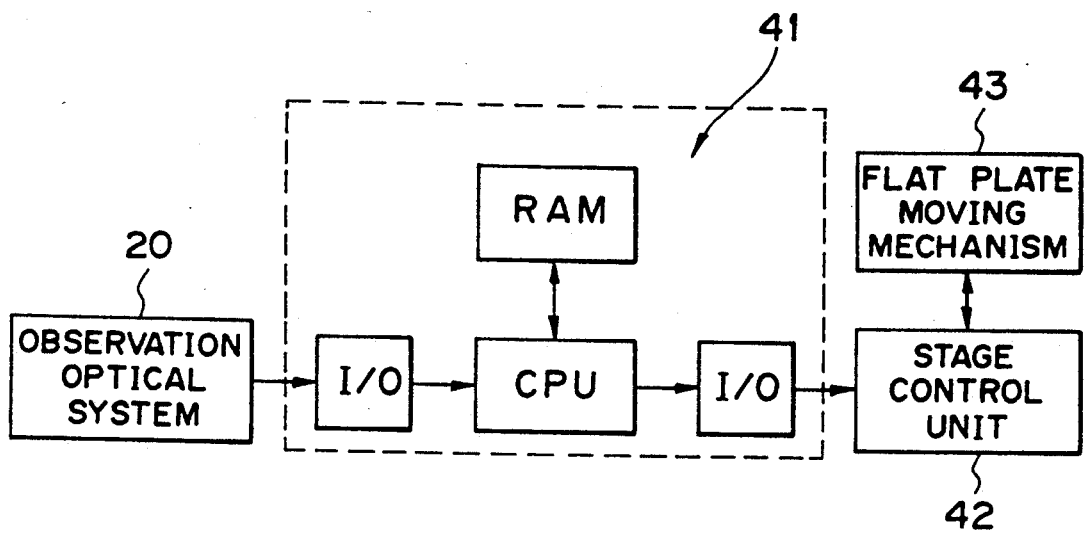
FIG. 4 is a view for illustrating an embodiment of the alignment quantity calculation unit to be used for the above apparatus.

The alignment quantity calculation unit 41 may be constituted, e.g., by use of an input/output interface (I/O), a central processing unit (CPU) and a random access memory (RAM), as shown in FIG. 4.

The calculation result provided by the alignment quantity calculation unit 41 is output to the flat plate moving unit 43 as a control signal by the medium of the stage control unit 42.

More specifically, in the stage control unit 42, the flat plate moving unit 42 receives a control signal required for moving the work surface plate 30 to a position where the superposition of the pattern side register mark 4 and the work side register mark 5 is observed while retaining a predetermined registration gap H with respect to the positional relation between the pattern side register mark 4 and the work side register mark 5 in a horizontal direction (i.e., x-axis direction, y-axis direction and a direction corresponding to an angle $\theta$ counted from the origin), in a two dimensional system (i.e., x-y coordinate system). The work surface plate 30 has a function of supporting the transfer-receiving flat plate 2 and is movable by means of the flat plate moving mechanism 43. In the flat plate holder 50, the pattern-transferring flat plate 1 can be retained or released.

The flat plate moving mechanism 43 may be constituted, e.g., by use of various motors such as a linear motor and a pulse motor capable of providing a minute step.

Figure 1C:
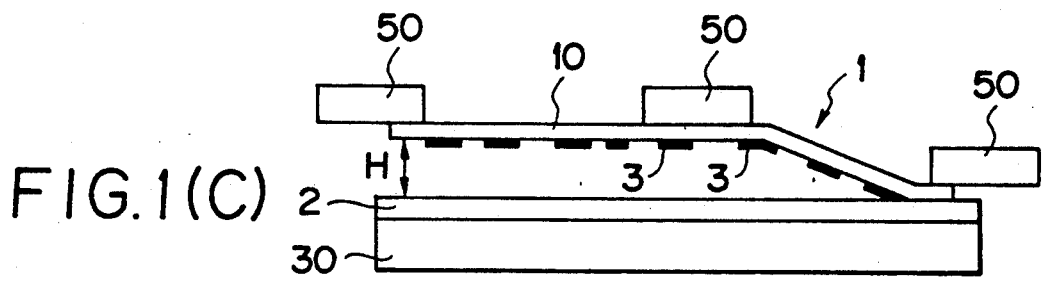

After the registration between the pattern-transferring flat plate 1 and the transfer-receiving flat plate 2 is effected in the manner as described above, the ends of the pattern-transferring flat plate 1 and the transfer-receiving flat plate 2 are nipped and are fixed to each other, while the registration gap H therebetween is maintained, as shown in FIG. 1(C). As shown in the Figure, when such fixing is intended to be effected, the flat plate holder 50 for retaining the end (on the right side in the Figure) of the pattern-transferring flat plate 1 may be moved to press-contact the end of the flexible pattern-transfer flat plate 1 to the end of the transfer-receiving flat plate 2, and such a state may be maintained. In such a case, it is also possible that register marks are provided on the ends of the flat plates 1 and 2 having no pattern, respectively, and both of these flat plates are manually press-contacted to each other so that the register marks are superposed on each other.

At this time, in the pattern-transferring flat plate 1, deflection occurs as shown in FIG. 1(C).

Figure 1D:
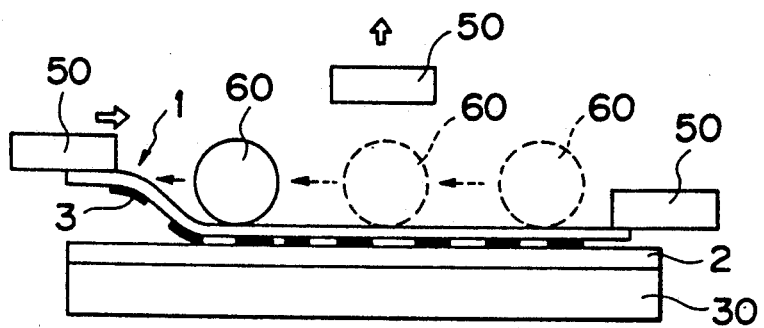

Then, as shown in FIG. 1(D), while the ends of the flat plates 1 and 2 are press-contacted to each other, the entire surfaces of the flat plates are sequentially press-contacted to each other from the fixed end position. Such press-contact may be effected, e.g., by moving a pressing roller 60 from the fixed end position toward the other end at which the registration gap H is maintained between the flat plates 1 and 2 to effect local pressing. In this manner, the press-contact may be effected while attaining uniform adhesion strength. As shown in FIG. 1(D), the flat plate holders 50 sequentially release the pattern-transferring flat plate 1 and are moved to a position at which the flat plate holder 50 does not obstruct the pressing roller 60. In FIG. 1(D), a hollow arrow denotes the moving direction of the flat plate holder 50.

Figure 5:
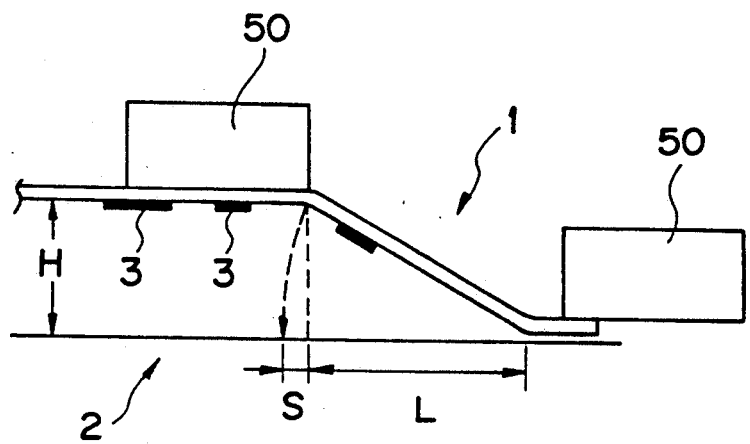
FIG. 5 is a view for illustrating a state of the pattern-transferring flat plate in a pressing step for the pattern-transferring flat plate and the transfer-receiving flat plate to be used in the alignment transfer method according to the present invention.

As shown in FIG. 5, there occurs a difference (so-called "image shift") S between the positional relation between the pattern-transferring flat plate 1 and the transfer-receiving flat plate 2 disposed opposite to each other with the registration gap H, which is observed at this time, and the positional relation therebetween at the time of the press-contact of both of the flat plates. In other words, the length L observed from the transfer-receiving side of the flat plate 2 by the medium of the registration gap H, corresponds to the length (L+S) as the time of the press-contact of both of the flat plates. More specifically, in FIG. 5, the deflected portion of the pattern-transferring flat plate 1 disposed opposite to the portion of the transfer-receiving flat plate 2 having the length L has a length of $\sqrt{L^2+H^2}$, and therefore the image shift quantity S as described above is represented by the following formula:

$$S = \sqrt{L^2 + H^2} - L$$

For example, when L=100 mm, H=1 mm, the image shift quantity S is about $5 \times 10^{-3}$ mm.

Accordingly, the pattern side register mark 4 to be provided on the pattern-transferring flat plate 1 may be formed at a position of the pattern-transferring flat plate 1 which is capable of preliminarily correcting (or compensating) the image shift quantity S. If a predetermined positional relation between the pattern side register mark 4 and the work side register mark 5 is observed, the transfer pattern 3 will be caused to closely contact a predetermined position of the transfer-receiving flat plate 2 when the pattern-transferring flat plate 1 is sequentially press-contacted to the transfer-receiving flat plate 2.

Figure 1E:
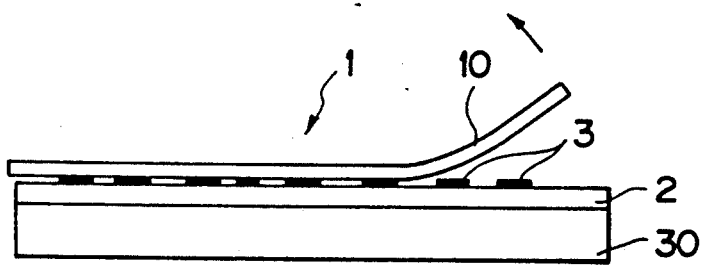
Figure 1F:
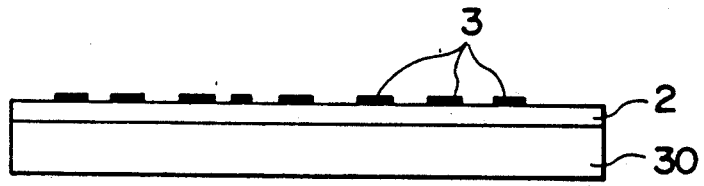

When the pattern-transferring flat plate 1 is peeled from the transfer-receiving flat plate 2 from the press-contacted ends of these flat plates as shown in FIG. 1(E) after the pattern-transferring flat plate 1 is press-contacted to the transfer-receiving flat plate 2, the transfer pattern 3 is released from the pattern-transferring flat plate 1, and is transferred to a predetermined position of the transfer-receiving flat plate 2. The transfer pattern 3 which is transferred to the transfer-receiving flat plate 2 as shown in FIG. 1(F) may provide uniform adhesion strength, may be excellent in the positioning precision and the reproducibility therefor, and may satisfy the level of the positioning precision and reproducibility therefor (1 to 5 μm, for example), required for an electroconductive minute pattern for a thin film semiconductor element, etc.

Next, there will be described another embodiment of the present invention with reference to FIGS. 6A to 6C. In these Figures, the same members as those used in the above embodiment are denoted by the same reference numerals, and the description thereof is omitted.

Figure 6:
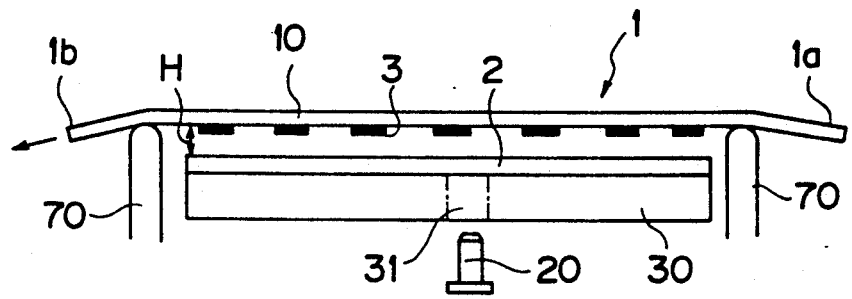
FIGS. 6(A) to 6(C) are schematic views for sequentially illustrating the relation between the pattern-transferring flat plate and the transfer-receiving flat plate in each of sequential steps used in another embodiment of the alignment transfer method according to the present invention.
Figure 6:
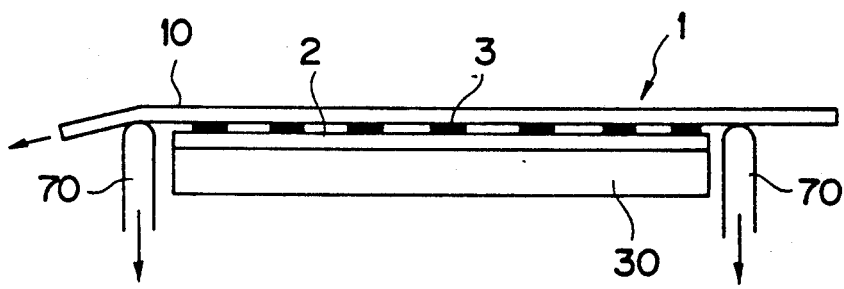
Figure 6:
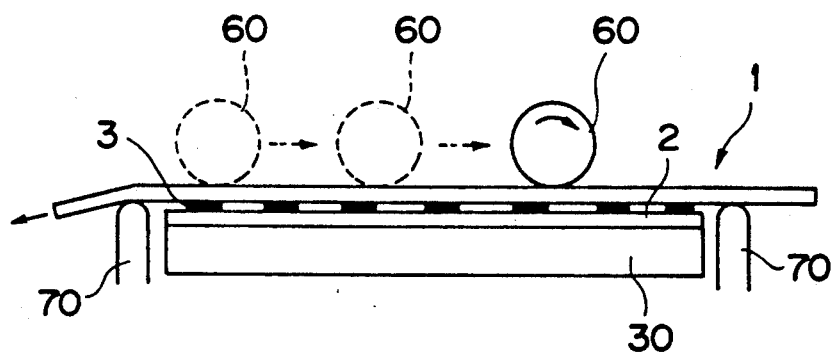

In FIG. 6(A), one end 1a of a pattern-transferring flat plate 1 is fixed and the other end 1b thereof is supplied with a tensile load in the direction of an arrow. The pattern-transferring flat plate 1 is stretched between two supporting members 70 and 70. Below the pattern-transferring flat plate 1, a transfer-receiving flat plate 2 is disposed opposite thereto with a uniform registration gap H. Similarly as in the above embodiment, the pattern-transferring flat plate 1 has a flexibility, and in the pattern-transferring flat plate 1, a transfer pattern 3 which is transferable to the transfer-receiving flat plate 2 is formed, and a pattern side register mark (not shown) is also formed for the purpose of precise positioning between the pattern-transferring flat plate 1 and the transfer-receiving flat plate 2.

On the other hand, in the transfer-receiving flat plate 2 to which the transfer pattern 3 is to be transferred, a work side register mark (not shown) is formed for the purpose of precise positioning between the pattern transferring flat plate 1 and the transfer-receiving flat plate 2.

The positioning (or registration) between the pattern-transferring flat plate 1 and the transfer-receiving flat plate 2 disposed opposite to each other with the registration gap H is effected in the same manner as in the above embodiment. More specifically, in a state where the registration gap H is maintained, while the positional relation between the pattern side register mark disposed on the pattern-transferring flat plate 1 and the work side register mark disposed on the transfer-receiving flat plate 2 is optically observed by means of an observation optical system 20, at least one of the pattern-transferring flat plate 1 and the transfer-receiving flat plate 2 is moved, in accordance with the information provided by the observation optical system 20, to a position at which a predetermined relation between the pattern side register mark and the work side register mark is observed.

After the registration between the pattern-transferring flat plate 1 and the transfer-receiving flat plate 1 is effected in the manner as described above, the supporting members 70 and 70 are downward moved as shown in FIG. 6(B) so that the entire surfaces of the pattern-transferring flat plate 1 and the transfer-receiving flat plate 2 are caused to contact each other.

Then, as shown in FIG. 6(C), a pressing roller 60 is moved on the pattern-transferring flat plate 1 from one side thereof to the other side thereof so as to effect local press-contact. As a result, the pattern-transferring flat plate 1 and the transfer-receiving flat plate 2 are caused to closely contact each other so as to provide a uniform adhesion strength. Then, the application of the tensile load to the end portion 1b of the pattern-transferring flat plate 1 is stopped, and the fixing of the end portion 1a of the pattern-transferring flat plate 1 is released. Thereafter, when the pattern-transferring flat plate 1 is peeled from the transfer-receiving flat plate 2 from the press-contacted ends of these flat plates in the same manner as in the above embodiment, the transfer pattern 3 is released from the pattern-transferring flat plate 1, and is transferred to a predetermined position of the transfer-receiving flat plate 2.

Next, there will be described a further embodiment of the present invention with reference to FIGS. 7(A) and 7(B). In these Figures, the same members as those used in the above two embodiments are denoted by the same reference numerals, and the description thereof is omitted.

Figure 7:
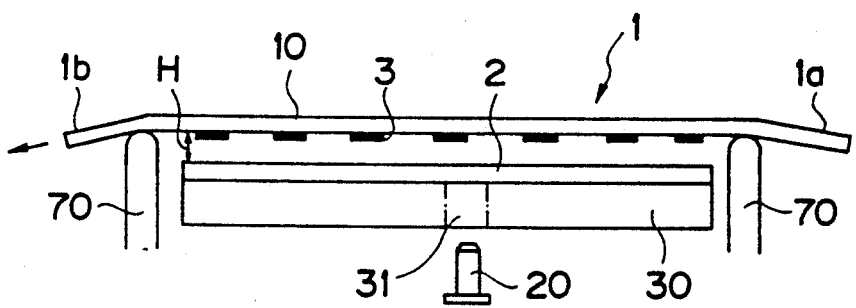
FIGS. 7(A) and 7(B) are a schematic views for sequentially illustrating the relation between the pattern-transferring flat plate and the transfer-receiving flat plate in each of sequential steps used in another embodiment of the alignment transfer method according to the present invention.
Figure 7:
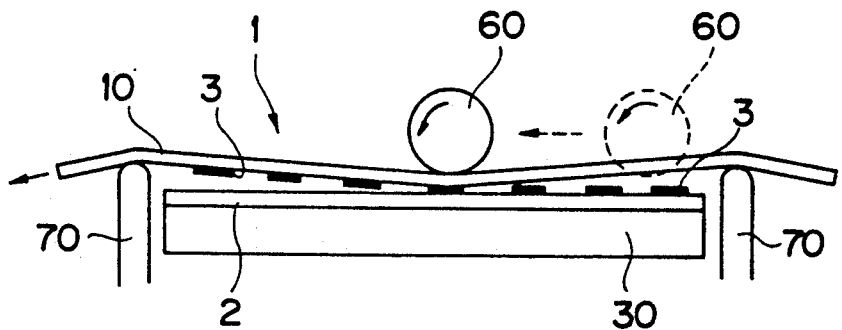

FIG. 7(A) shows a relation between the pattern-transferring flat plate 1 and the transfer-receiving flat plate 2. At this stage, the relation is the same as in the above embodiment which has been described with reference to FIG. 6(A). Then, the registration between the pattern transferring flat plate 1 and the transfer-receiving flat plate 2 is effected in the same manner as in the above embodiment, while retaining the registration gap H therebetween. Then, as shown in FIG. 7(B), while the registration gap H between the pattern-transferring flat plate 1 and the transfer-receiving flat plate 2 is maintained, the pressing roller 60 is moved on the pattern-transferring flat plate 1 from the one end portion 1a thereof to the other end portion 1b thereof. As a result, these flat plates 1 and 2 are locally pressed to each other so as to attain uniform adhesion strength.

In this embodiment, since the pattern-transferring flat plate 1 is always stretched between the supporting members 70 and 70, a portion of the pattern-transferring flat plate 1 by which the pressing roller 60 has passed is sequentially peeled from the transfer-receiving flat plate 2. As a result, the transfer pattern 3 is released from the pattern-transferring flat plate 1, and is transferred to a predetermined position of the transfer-receiving flat plate 2.

In the second and third embodiments as described above, the image shift similarly occurs. In such a case, it is possible to form a pattern side register mark at a position which is capable of preliminarily compensating the image shift quantity S, in the same manner as in the above first embodiment.

In the embodiments as described above, the pattern is transferred by a printing process using a so-called parallel flat plate system. In addition, the alignment transfer method according to the present invention is also applicable to a printing process using a so-called vertical flat plate system.

Next, there will be described the formation of the transfer pattern 3 as described above.

Figure 8:
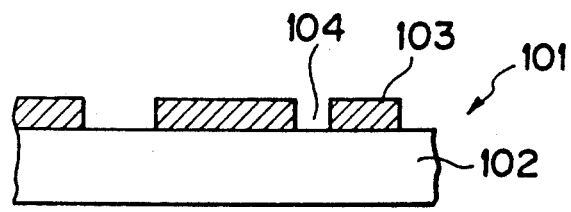
FIGS. 8(A) to 8(C) are schematic sectional views each showing an embodiment of the structure of a pattern-transferring plate in a flat form.
Figure 8:
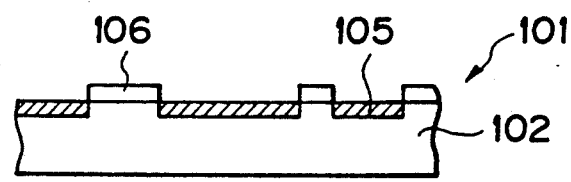
Figure 8:
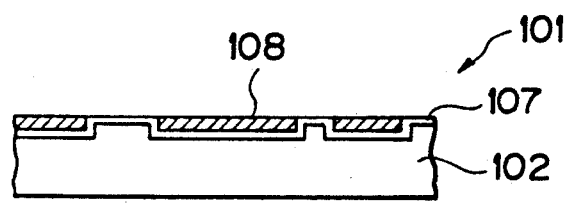

FIG. 8 is a schematic sectional view showing an embodiment of the structure of a pattern-transfer plate in a flat form. First, a pattern-transferring flat plate 101 as shown in FIGS. 8(A), 8(B), or 8(C) is prepared. In FIG. 8(A), the pattern-transferring flat plate 101 comprises a substrate 102 having an electroconductivity and a desired resist pattern 103 disposed thereon which has been formed by an ordinary photolithographic method such that a photoresist is applied onto the substrate 102, the resultant coated substrate is exposed to a desired image pattern and is subjected to developing and drying, and is further subjected to baking, as desired.

The substrate 102 having an electroconductivity may comprise an electroconductive material such as metal plate, or may comprise a member comprising a substrate of a non-conductive material at least surface of which is supplied with an electroconductivity by bonding, coating or vapor deposition (or vacuum deposition) of a conductive member (or material) such as tin oxide, indium tin oxide, (ITO), and carbon. The above electroconductive surface may preferably assume a state capable of providing an adhesion strength such that an electrodeposition substance deposited by an electrolysis step which is to be effected subsequently may adhere thereto with an appropriate strength, and such a substance may easily be peeled in a subsequent transfer step. Accordingly, the surface of the substrate 102 may be subjected to mirror finish (or mirror polishing) so as to provide a low adhesion strength, and then may be used in such a state for the above purpose. In consideration of the above factors, when the material of the substrate 102 comprises a metal, it may preferably comprise a stainless steel plate or copper plate coated with nickel plating or chromium plating. Further, the photoresist used for such a purpose may be a resist having a good electrical insulating property.

According to the above step, there are formed on the substrate 102 an electrical insulating photoresist pattern 103 and a line image portion 104 in which the electroconductive surface is provided, in the next process, by the deposition of the electrodeposition substance based on an electrolysis reaction.

On the other hand, the pattern-transferring flat plate 101 as shown in FIG. 8(B) may be formed by forming a concavity in the electroconductive substrate 102 by chemical milling or etching based on photoetching, by mechanical cutting, etc.; filling the resultant concavity with a substance 105 having a good adhesion property and a good insulating property; and then subjecting the resultant product to hard chromium (or chrome) plating to form a chromium layer 106. The portion filled with the above substance 105 forms a non line image portion, and the portion supplied with the chromium layer forms a line image portion. When the hard chromium plating is effected in such a manner, the printing repeatability, i.e., printing resistance may be improved.

Further, the pattern-transferring flat plate 101 as shown in FIG. 8(C) may be formed by forming a concavity in the electroconductive substrate 102 by a similar method of as in the case of FIG. 8(B); subjecting the entire surface of the substrate 102 provided with the concavity to hard chromium (or chrome) plating to form a chromium layer 107; and filling the resultant concavity with a substance 108 having a good adhesion property and a good insulating property.

In the description appearing hereinafter, the pattern-transferring flat plate 101 as shown in FIG. 8(A) is used. However, as a matter of course, the following description is similarly applicable to the printing plate as shown in FIG. 8(B) or FIG. 8(C).

Figure 9:
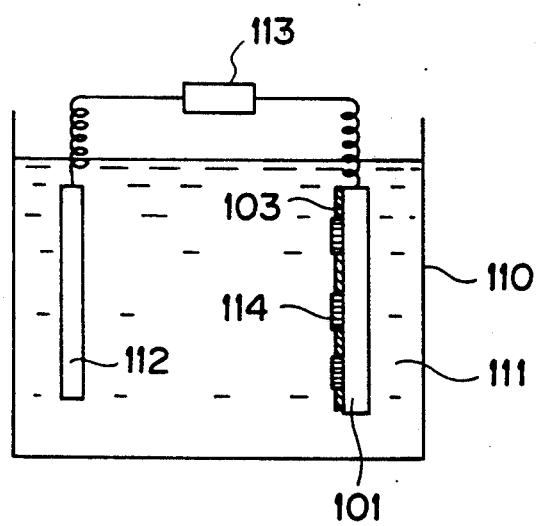
FIG. 9 is a schematic view for illustrating the deposition of an electrodeposition ink by electrolysis.
Figure 10:
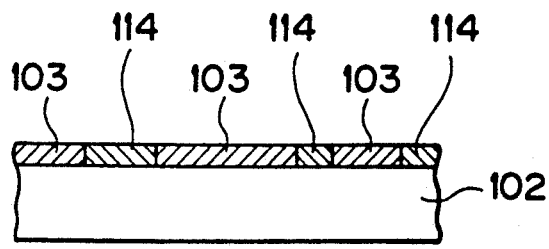
FIG. 10 is a schematic sectional view showing a state wherein the electrodeposition ink is deposited on the pattern-transferring flat plate.

The pattern-transferring flat plate 101 is prepared in the manner as described above. Then, an electrolyte liquid 111 containing an electrodeposition substance component is charged into an appropriate electrolytic cell 110, the pattern-transferring flat plate 101 is used an electrode on one side, and an electroconductive member comprising an appropriate material is used as the electrode 112 on the other side, as shown in the sectional view of FIG. 9. Thereafter, a DC power supply 113 is connected with these electrodes, and electrolysis is conducted under a proper voltage so as to provide a proper current. As a result, as shown in the sectional view of FIG. 10, the electrodeposition substance 114 is deposited on the line image portion 104 shown in FIG. 8(A).

As a matter of course, the material usable as the electrodeposition substance is one capable of showing an electrochemical behavior and being deposited on one electrode side. In general, metals are known as materials for electroplating. As such metals, universal materials may widely be used. In the present invention, however, it is preferred to use Ni, Cr, Fe, Ag, Au, Cu, Zn, Sn, or compounds or alloys containing at least one of these metals. The reason for this is that these metals may provide good properties after the electrodeposition such as film forming property, thin film shielding property and resolution (or resolving power).

On the other hand, an electrodeposition substance comprising an organic materials (or polymer materials) is known. In the prior art, there has been a report wherein various vinyl compounds are electrochemically polymerized on an Fe electrode thereby to obtain a polymer film (Metal Surface Technique (Kinzoku Hyomen Gijutsu) Vol. 19, No. 12, 1968). Recently, there have been conducted researches wherein an electroconductive polymer film comprising polypyrrole or polythienylene is formed from pyrrole or thiophene on an electrode.

As another method, there is known a method wherein a polymer is deposited from a polymer solution on an electrode by using insolubilization thereof. For example, there is well known an electrodeposition coating method wherein a colored pigment is dispersed in a polymer solution and a colored coating film is formed on an electrode by using such a solution. Accordingly, in general, it is possible to use a material which has been developed to be used for the electrodeposition coating of an automobile.

The electrodeposition may be classified into cationic electrodeposition and anionic electrodeposition depending on the reaction between the electrodeposition substance and a main electrode as an electrodeposition electrode, i.e., depending on whether the electrodeposition substance is present as a cation or it behaves as an anion.

Specific examples of the organic polymer substances usable in the electrodeposition may include: natural fat and oil type, synthetic fat and oil type, alkyd resin type, polyester resin type, acrylic resin type, epoxy resin type, etc.

In the anionic type, there have been known maleic modified oils and polybutadiene type resins. In such a case, the curing (or hardening) is based on an oxidation polymerization reaction.

The cationic type has widely been used for general electrodeposition coating. In such a case, an epoxy resin may mainly be used as such or after the modification thereof. The curing thereof is generally effected by using a crosslinking agent of an isocyanate type. In addition, there may mainly be used polybutadiene type resins and so-called polyamino type resins such as melamine type resin and acrylic type resin.

These electrodeposition films may be cured (or hardened) by oxidation polymerization, thermal polymerization, or photopolymerization, etc., thereby to form a film having good corrosion resistance. Particularly, an anionic type acrylic resin has been disclosed as an ultraviolet ray curing electrodeposition resin for forming a negative type image.

As described above, the transfer pattern may generally formed as a metal or organic resin film on the pattern-transferring flat plate, but the electrodeposition substance generally has no adhesion property. When a viscous substance having a tackiness or adhesiveness is used as described hereinabove, it is difficult to faithfully reproduce the transfer pattern at the time of the transfer thereof. Accordingly, in this embodiment, the above solid pattern is used so as to prevent the deformation thereof based on an external force such as pressure. Accordingly, the pattern substance per se has no adhesiveness or tackiness, or has very little adhesiveness or tackiness, if any.

Therefore, in order to transfer the deposited electrodeposition substance, it is necessary to subsequently impart adhesiveness or tackiness to such a substance. In such a case, it is possible to use a method wherein a tackifying agent or adhesive agent is applied to the work surface or the pattern transfer surface after the electrodeposition.

The tackifying agent may for example comprise a universal adhesive (agent) such as vinyl chloride vinyl acetate, natural rubber type, synthetic rubber type, various acrylate types, and epoxy type; a heat sensitive thermoplastic adhesive, or a light curing (or light hardening) adhesive, etc..

The non-line image portion of the adhesive layer which has been formed for the purpose of transferring the electrodeposition pattern, is not necessary for the etching of the work surface. Accordingly, it is necessary to remove the adhesive layer in the non-line-image-portion. As a method for effecting such removal, it is convenient to use a dry etching method in combination with a plasma incineration method in the presence of oxygen. In such a case, the organic electrodeposition substance is also subjected to incineration. However, since the electrodeposition substance layer has a larger thickness than that of the adhesive layer, the adhesive layer may be removed prior to that of the electrodeposition substance layer, even when the incineration velocities for these layers are the same.

In practice, the resistance to the incineration may be imparted to the electrodeposition substance layer by selecting the electrodeposition agent and mixing therewith a substance (such as fine inorganic material) which provides a small incineration velocity or is not subjected to incineration.

In a case where the electrodeposition substance comprises a metal, when the surface of the substrate for the electrodeposition is subjected to an appropriate release treatment or is provided with a conductive face having little compatibility with the electrodeposition metal, it is possible to obtain an adhesion property which is capable of attaining easy electrodeposition and easy transfer. For example, it is possible to use chromic acid treatment, mirror surface nickel plating, chromium plating, or a metal substrate such as stainless steel plate which originally shows poor adhesion to the electrodeposition metal.

On the other hand, the organic electrodeposition material based on the material for the electrodeposition coating, which is to be used for such a purpose, mostly shows good adhesion to the electrodeposition substrate. In such a case, even when a transfer adhesive layer is disposed between the work surface and the electrodeposition substance deposited thereon by the electrodeposition, the adhesion between the electrodeposition substance and the substrate can be too strong in some cases so that it cannot be subjected to peeling and transferring, or is partially broken and subjected to the transferring. As a result, good pattern transfer cannot be effected in some cases.

In such a case, it is preferred that the substrate is preliminarily provided with a thin metal film comprising a metal which has a poor compatibility with the metal material of the substrate and has a good releasability, by primary electrodeposition, and then the resultant product is provided with the intended organic electrodeposition substance by secondary electrodeposition. When such electrodeposition substance is intended to be transferred by the medium of the adhesive layer, it may easily be peeled at the interface between the substrate and the primary electrodeposition metal to be transferred. After the transfer, the resultant coating comprises the organic electrodeposition substance covered with the primary electrodeposition metal.

Accordingly, when the primary electrodeposition metal is removed by etching after the transfer operation, an intended pattern of the organic electrodeposition substance may be obtained. In such a case, the electrodeposition substance is transferred while being covered with the primary electrodeposition metal, thereby to provide an excellent image without the breakage or deformation of the electrodeposition substance.

As such a primary electrodeposition metal aiding the above peeling and transferring, it is possible to use all of the metals described above as general releasing electrodeposition metals. However, it is preferred to use a metal such that it may be used in a less hazardous etching liquid and may easily be subjected to the etching, when removed by etching after the transfer operation. For example, metals such as Ag, Ni and Cu may particularly preferably be used for such a purpose. However, the metals usable for such a purpose should not be restricted to these metals.

When the above method using the peelable primary metal electrodeposition is used, the transfer may completely be effected even in the case of a material showing a relatively poor film forming property at the time of the electrodeposition. Accordingly, it is possible to obtain a line image without a pin hole or unevenness.

Next, there will be described another embodiment for forming a transfer pattern 3.

FIG. 11(A) to 11(E) are schematic views for illustrating steps for forming a transfer pattern on a substrate.

Figure 11A:
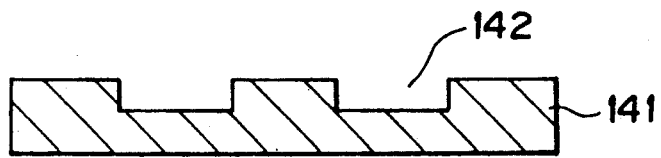
FIGS. 11(A) to 11(E) are schematic views for illustrating steps for forming a transferring pattern on the pattern-transferring flat plate in a flat form.

FIG. 11(A) shows a pattern-transferring flat plate 141. The plate 141 may comprise an intaglio plate as shown in the Figure or a planographic plate as described hereinafter.

When the plate 141 comprises an intaglio plate, concavities 142 capable of providing a printing line image are formed on the intaglio plate 141. When the plate 141 comprises a planographic plate, pattern portions corresponding to the above concavities 142 are formed on the planographic plate. The method of formation of the concavities 142 is not particularly restricted. The concavities may for example be formed by cutting a smoothly ground metal flat plate material (generally, a metal such as copper, copper alloy, iron, and iron alloy) by a fine cutting method, or by optically forming a resist mask on the plate material, and then subjecting the resultant material to etching. The concavities 142 mat be formed as fine (or minute) concavities having a line width of about 5 to 50 μm, and a depth (plate depth) of about 1 to 10 μm. The flat plate material may also comprise a material having a flexibility such as metal thin plate and plastic film. Further, in other to enhance the hardness of the surface of the intaglio plate 141, the surface may be coated with plating of a hard metal such as nickel and chromium. In such a case, the plate surface may be supplied with resistance to ink scraping effect by a doctor. In order to form a pattern portion of the planographic plate, it is possible to use a known plate making method used for planographic printing.

Figure 11B:
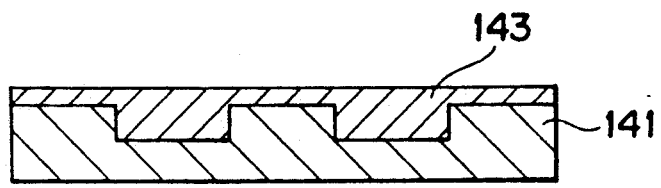

Then, a curing type ink 143 is applied onto the surface of the above pattern-transferring flat plate (intaglio plate) 141, as shown in FIG. 11(B). The application of the ink may easily be effected by dipping the plate into an ink reservoir, or by pouring the ink over the plate surface.

The ink used for such a purpose may be a heat curing (or hardening) type, ionizing radiation curing type, etc., and may preferably be one of a solventless type having a relatively low viscosity. Specific examples of the ink to be used for such a purpose may generally include commercially available inks such as ultraviolet ray curing ink, electron beam curing ink, and infrared ray (or heat) curing type. The present invention is also advantageous because it may use the known inks as described above. In the case of the ultraviolet ray curing ink, the basic composition of the ink 143 contains no solvent and comprises a photosensitive prepolymer (or a monomer and a photopolymerization initiator) as a binder, a coloring pigment and an appropriate ink aid such as sensitizer and tackiness regulating agent. It is also possible to use one selected from photoresist materials used for semiconductor processing, photoetching, etc., in place of the ordinary ultraviolet ray curing ink. In addition, it is not necessary to use a high viscosity ink as in the conventional planographic printing process but an ink having a somewhat low viscosity is also usable. The viscosity of the ink may be regulated by selecting, as a binder, a low viscosity prepolymer or a monomer containing a photopolymerization initiator.

Figure 11C:
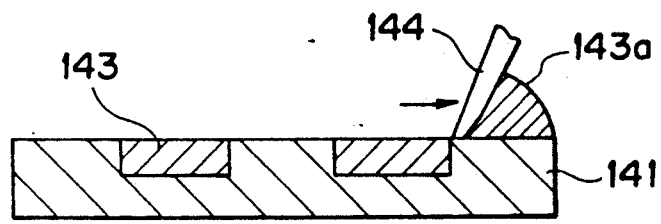
Figure 11D:
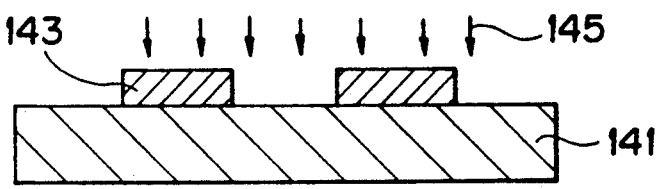

In a case where the plate 141 comprises an intaglio plate, after the application of the ink 143 to the plate 141, the unnecessary ink 143a disposed on the surface of the intaglio plate 141 is scraped off a doctor blade 144 comprising a thin metal blade, etc., to be removed therefrom, as shown in FIG. 11(C), and the concavities 142 capable of providing a printing line image are selectively filled with the ink 143. On the other hand, in a case where the flat plate 141 comprises a planographic plate, the curing type ink 143 applied thereonto selectively adheres to the pattern portion spontaneously on the basis of the interaction between the surface energy of the plate and that of the ink, as shown in FIG. 11(D). In each of the above plates, the ink 143 is subjected to patterning at this step, thereby to form a transfer pattern.

Figure 11E:
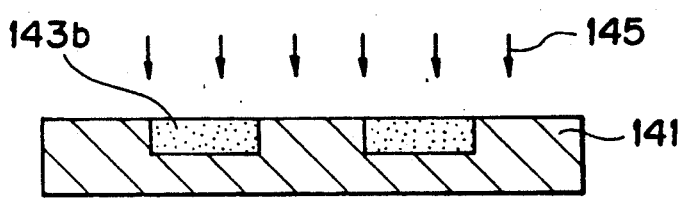

Then, as shown in FIG. 11(E), the ink 143 disposed in the concavity 142 is subjected to curing treatment by using irradiation thereof with heat or radiation 145 to reaction activate the ink so that a viscosity increasing reaction or curing reaction is caused to occur in the concavity 142 and the fluidity of the ink is removed to form a cured (or solid) ink 143b. In the case of the planographic plate, as shown in FIG. 11(D), a viscosity increasing reaction or curing reaction occurs on the plate on the basis of the irradiation thereof with heat, radiation or electron beam 145 in the same manner as in the case of the intaglio plate, and the ink 143 subjected to the patterning is converted into the cured ink (or transfer pattern) 143b. At this time, the degree of curing may preferably be 90% or higher as a whole in terms of gel fraction.

Next, the present invention will be described in further detail with reference to a specific Example.

First, a water-soluble photosensitive liquid predominantly comprising a polyvinvyl alcohol (PVA) and ammonium dichromate was applied one a 0.2 mm thick stainless steel plate substantially having a mirror surface by rotation coating (or spin coating). The resultant coating film had a thickness of 1.0 μm after being dried. Then, the resultant coated product was exposed so as to provide a desired thin line pattern, and thereafter subjected to aqueous development at 30° C. and drying. Further, the resultant product was subjected to heat treatment (or burning) at 230° to 260° C. for 10 min., so as to improve the water resistance and electric insulating property, whereby a pattern-transferring flat plate was obtained.

Then, the pattern-transferring flat plate was subjected to Ni plating by using an Ni plate as an anode and the flat plate per se as a cathode, so that the exposed electroconductive line image portion of the pattern-transferring plate was subjected to the Ni plating, thereby to form a transfer pattern.

The plating conditions for the Ni plating were as follows:
Ni plating bath composition:
  Nickel sulfate: 240 to 340 g/l
  Nickel chloride: 45 g/l
  Boric acid: 30 to 38 g/l
pH: 2.5 to 5.5
Temperature: 40° to 70° C.
Electric current density: 2.5 to 10 A/cm$^2$ Under the above conditions, the plating operation was completed when the resultant Ni plating had a thickness of 1 μm. The resultant product was then washed with water and dried.

On the other hand, a film of poly-silicon (hereinafter, referred to as "p-Si") having a thickness of 0.1 μm was formed on a glass substrate to prepare a transfer-receiving flat plate (work) having an electroconductive thin film. Onto the p-Si, a solution of an adhesive agent of a vinyl chloride acetate type was applied to form an adhesive layer having a thickness of about 1 μm.

Then, as shown in FIGS. 6(A) to 6(C), an alignment apparatus wherein the end of 1a of the pattern-transferring flat plate 1 was fixed and a tensile load was applied to the other end 1b thereof was used, and a positional difference was calculated in the alignment quantity calculation unit, while the positional relation between the pattern side register mark and the work side register mark were optically observed. At this time, the distance between the fixed end 1a of the pattern-transferring flat plate 1 and the supporting member 70 was 100 mm, and the registration gap between the pattern-transferring flat plate and the work was 300 μm. The image shift between the positional relation between the pattern-transferring flat plate and the transfer-receiving flat plate which were observed by the medium of the above registration gap (300 μm), and the positional relation between these flat plates at the time of the press-contact to each other was compensated by forming the pattern side register mark at a position which was capable of preliminarily correcting the image shift quantity of 0.45 μm for the pattern-transferring flat plate. The image shift quantity of 0.45 μm was calculated as the above image shift quantity S according to the following formula:

$$S = \sqrt{100^2 + 0.3^2} - 100 = 0.00045 \text{ mm } (0.45 \text{ μm}).$$

Then, the work surface plate and the observation optical system were moved by use of the first plate moving mechanism to a position where a predetermined relation between the pattern side register mark and the work side register mark (i.e., in a state where the pattern side register mark was shifted toward the right side by 0.45 μm in FIG. 6(A) was observed. The observation optical system used herein comprised a CCD, and the alignment quantity calculation unit used herein comprised an image processing system (3Z4SP, mfd. by Omron K.K.).

When the positioning was completed, the supporting member was moved downward so that the entire surfaces of the adhesive layer of the transfer-receiving flat plate and the Ni plating surface of the pattern-transferring flat plate were caused to contact each other, and these flat plates were press-contacted to each other by using the pressing roller. Thereafter, when these flat plates were peeled from each other from the end side thereof, the Ni plating layer (transfer pattern) completely adhered to the adhesive layer of the transfer-receiving flat plate, i.e., the image of the Ni plating was transferred to the transfer-receiving flat plate. In the line image portion of the pattern-transferring flat plate, the original surface of the substrate was exposed so that it was capable of being subjected to the plating again.

Then, the adhesive agent disposed on the non-line image portion of the transfer-receiving flat plate having the image of the Ni plating was subjected to incineration treatment in oxygen plasma to expose the P-Si surface. At this time, it was confirmed that the line image portion was protected by the Ni plating layer and remained together with the adhesive layer corresponding to the image.

Then, the plasma gas was replaced by an argon gas containing a Freon gas mixed therewith, and the transfer-receiving flat plate was treated with an active fluorine gas so that the exposed p-Si layer was removed by dry etching. It was confirmed that the p-Si in the line image portion remained on the basis of the masking effect due to the Ni plating layer.

Thereafter, the transfer-receiving flat plate was dipped into methyl ethyl ketone (MEK) at 40° C. so that the adhesive agent was swelled or dissolved and was removed together with the surface Ni plating layer, whereby an image of the p-Si thin film was formed on the surface of the transfer-receiving flat plate.

In the resultant image of the p-Si thin film, the finished line image had a minimum line width of about 3 μm, and the line image portion had a variation of below 1 μm.

Then, a 0.1 μm thick gate insulating film of SiO$_2$ was formed on the transfer-receiving flat plate, end on the resultant insulating film, a 0.1 μm-thick gate p-Si film was further formed. Onto the resultant product, a solution of a vinyl chloride acetate type adhesive was applied so as to provide an about 1 μm-thick adhesive layer.

On the other hand, a transfer pattern for the gate p-Si film was formed in the same manner as described above.

Then, after correct positioning was affected by using the above alignment apparatus, a Ni plate layer of the pattern-transferring flat plate was transferred to the adhesive layer of the transfer-receiving flat plate. Further, the adhesive agent in the non-line image portion was removed and the exposed p-Si layer was subjected to dry etching in the same manner as described above so that the Ni plating layer was removed together with the adhesive layer on the transfer-receiving flat plate. Thereafter, the resultant product was subjected to ion implantation.

Then, a 0.3 μm-thick SiO$_2$ film as an interlayer insulating film was formed on the resultant product, and an etching operation for a contact hole was conducted in the same manner as described above.

Thereafter, a 0.1 μm-thick conductive film of aluminum (Al) was formed on the resultant product and an image of Al was formed in a predetermined position in the same manner as described above, whereby a thin film transistor (TFT) was prepared.

The present invention may be embodied in various ways without deviating the spirit or predominant feature thereof. Therefore, the embodiments as described above are only examples in all respects, and the present invention should not be restricted to the specific embodiments as described above. The scope of the present invention is defined by claims, and is not confined to the body of the specification. Any modification or change falling within equivalent range of the claims is in the scope of the present invention.

What is claimed is:

1. An alignment transfer method for press-contacting a pattern-transferring flat plate having a transfer-pattern to a transfer-receiving flat plate to transfer the transfer pattern to the transfer-receiving flat plate, the alignment transfer method comprising:

fixing an end of the pattern-transferring flat plate comprising a flexible substrate, and the transferable transfer pattern and a pattern side register mark provided thereon, and applying a tensile load to the other end thereof to stretch the pattern-transferring flat plate; disposing the transfer-receiving flat plate carrying a work side register mark and the pattern-transferring flat plate so that they are disposed opposite to each other with a uniform registration gap; and moving at least one of the pattern-transferring flat plate and the transfer-receiving flat plate in accordance with the information provided by an observation optical system while maintaining the registration gap and optically observing the positional relation between the pattern side register mark and the work side register mark by means of the observation optical system; thereby to effect positioning between both of the flat plates; and sequentially press-contacting the pattern-transferring flat plate and the transferring-receiving flat plate to each other from an end thereof, while maintaining the registration gap, thereby to transfer the transfer pattern to the transfer-receiving flat plate.

2. An alignment transfer method according to claim 1, wherein the observation optical system is constituted of a microscope, a CCD or a laser optical system.

3. An alignment transfer method according to claim 1, wherein the observation optical system is connected with a flat plate moving mechanism by the medium of an alignment quantity calculation unit and a stage control unit.

4. An alignment transfer method according to claim 1, wherein an adhesive layer is formed on a surface of at least one of the transfer pattern and the transfer-receiving flat plate.

* * * * *